United States Patent [19]

Barbour et al.

[11] 4,322,778
[45] Mar. 30, 1982

[54] HIGH PERFORMANCE SEMICONDUCTOR PACKAGE ASSEMBLY

[75] Inventors: Donald R. Barbour, Poughkeepsie; Guido A. Lemke; Steven Magdo, both of Hopewell Junction, all of N.Y.

[73] Assignee: International Business Machines Corp., Armonk, N.Y.

[21] Appl. No.: 115,580

[22] Filed: Jan. 25, 1980

[51] Int. Cl.³ .................. H01L 23/02; H05K 1/11; H05K 1/14
[52] U.S. Cl. .................. 361/414; 361/212; 361/348; 174/68.5; 357/80; 357/74
[58] Field of Search ............... 174/68.5; 361/414, 412; 357/80, 70, 74; 333/1, 346, 347, 348

[56] References Cited

U.S. PATENT DOCUMENTS

| | | | |
|---|---|---|---|
| 3,179,904 | 4/1965 | Paulsen | 333/1 |
| 3,577,037 | 5/1971 | DiPietro | 357/71 |
| 4,193,082 | 3/1980 | Dougherty | 357/80 |
| 4,195,195 | 3/1980 | Demiranda et al. | 357/70 |
| 4,202,007 | 5/1980 | Dougherty | 357/70 |

OTHER PUBLICATIONS

IBM TDB, vol. 18, No. 5, Oct. 1975, p. 1440.
IBM TDB, vol. 19, No. 4, Sep. 1976, p. 1188.
IBM TDB, vol. 19, No. 8, Jan. 1977, p. 3046.

*Primary Examiner*—Andrew J. James
*Attorney, Agent, or Firm*—Stoffel, Wolmar J.

[57] ABSTRACT

An improved high performance semiconductor package assembly for interconnecting a plurality of integrated circuit devices having a multilayer substrate with internal wiring including signal wiring and external signal and power connections, a plurality of integrated circuit semiconductor devices supported on the top surface of substrate in electrically connected operative relation, the improvement being a power supply distribution system for providing electrical supply voltages to the devices from the power connections consisting of radial waveguide structure including parallel waveguide planes with a low input impedance to reduce switching noise, the waveguide planes located between the signal fan-out wiring and internal wiring metallurgy and connected in common to all of the plurality of devices.

20 Claims, 7 Drawing Figures

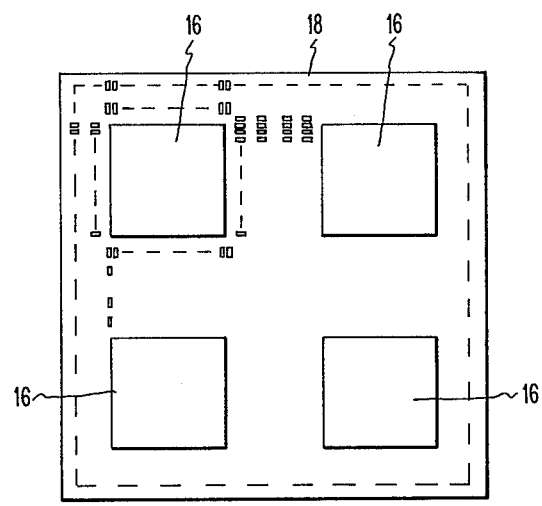
FIG. 2
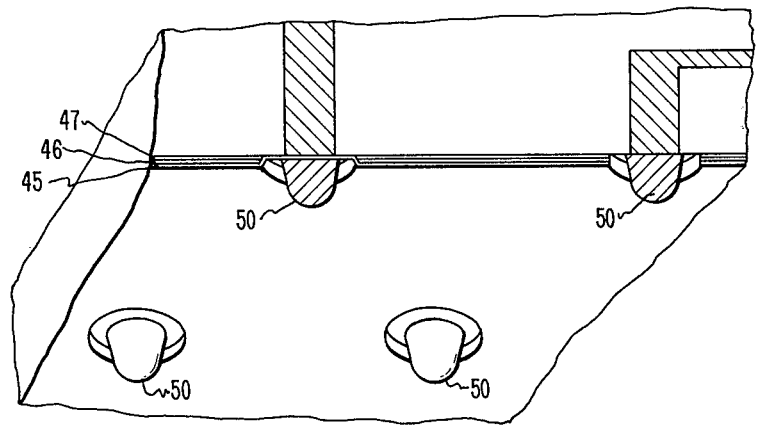
FIG. 3
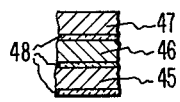

HIGH PERFORMANCE SEMICONDUCTOR PACKAGE ASSEMBLY

TECHNICAL FIELD

Our invention relates to semiconductor package structures, more particularly to high performance package assemblies adapted to efficiently handle very high switching speeds.

With the trend in the semiconductor technology of producing devices of ever increasing microminiaturization and more elements on a single device, there exists the pressing need for providing a compatible semiconductor package for supporting the devices. Compatibility is desired in order to sustain the advantages of lower cost, higher speeds and greater efficiency that are obtained by the microminiaturization of semiconductor devices.

BACKGROUND ART

As the integrated circuit technology advances towards ever increasing large-scale integration and high performance circuits, it is necessary to provide interconnection electrical packaging that is compatible with the performance demands of the associated device technology. Thus the problems of signal delay, package impedance and cross talk are extremely critical. The principles of transmission line technology must be engineered into the semiconductor packages in order to handle the extremely high device switching speeds.

Laminated multi-layer boards provided with internal wiring are well known as illustrated and described in U.S. Pat. No. 3,564,114. Multi-layer ceramic substrates capable of mounting and interconnecting a plurality of semiconductor devices are also well known as indicated by an article entitled "A Fabrication Technique for Multi-Layer Ceramic Modules" by H. D. Kaiser et al. in *Solid State Technology*, May 1972 P. 35–40. In this technology green sheets of ceramic, i.e., ceramic powder held together in sheet form by temporary organic binders, are metalized with noble or refractory metals, usually by screen printing. The metalized sheets are stacked, laminated, and fired to form a monolithic ceramic package. This technology affords an opportunity to do three-dimensional wiring in what was formerly waste or inaccessible space in a ceramic substrate. The use of this waste space results in the creation of the high density, sturdy electronic package with good performance and reliability. With the advent of microminiaturized large scale integrated circuit semiconductor devices with their accompanying faster speeds of operation, the compatibility of the substrate and the devices supported thereon became extremely important. In order to control and predict the operating characteristics of the substrate, such as signal delay, cross talk, etc., it becomes increasingly important to control the impedance and capacitance characteristics of the internal wiring, as well as the length. The increased density of the semiconductor devices on the substrate also imposes formidable cooling requirements in order to maintain the temperature of the device as safe operating ranges during operation.

DISCLOSURE OF THE INVENTION

An object of the present invention is to provide an improved semiconductor package having a laminated multilayer ceramic substrate and provided with signal transmission line structure with low noise.

Another object of this invention is to provide an improved package assembly for interconnecting integrated circuit semiconductor devices that is provided with an improved power supply distribution system which includes radial waveguide structure with parallel waveguide planes of a low input impedance with the waveguide planes located in close proximity to the semiconductor devices.

Another object of this invention is to provide an improved package assembly for interconnecting a plurality of integrated circuit semiconductor devices wherein the package is capable of handling very high frequency electrical pulses and is compatible with devices having very high operating speed.

In accordance with the present invention, there is provided a package assembly for interconnecting a plurality of semiconductor devices which includes an improved power supply distribution system for conveying electrical supply voltages to the devices from power planes in the substrate which system includes radial waveguide structure with parallel waveguide planes with a low characteristic impedance, preferably less than 0.2 ohms and located parallel to the chips. The distance between the chips and the waveguide planes is preferably less than 50 mils.

BRIEF DESCRIPTION OF DRAWINGS

The details of our invention will be described in connection with the accompanying drawing in which:

FIG. 2 is a top plan view of an interposer element which is one of the elements of the first embodiment of the invention.

FIG. 3 is a prospective view in broken section of the bottom side of the interposer structure.

BEST MODES FOR CARRYING OUT THE INVENTION

Figure 1:
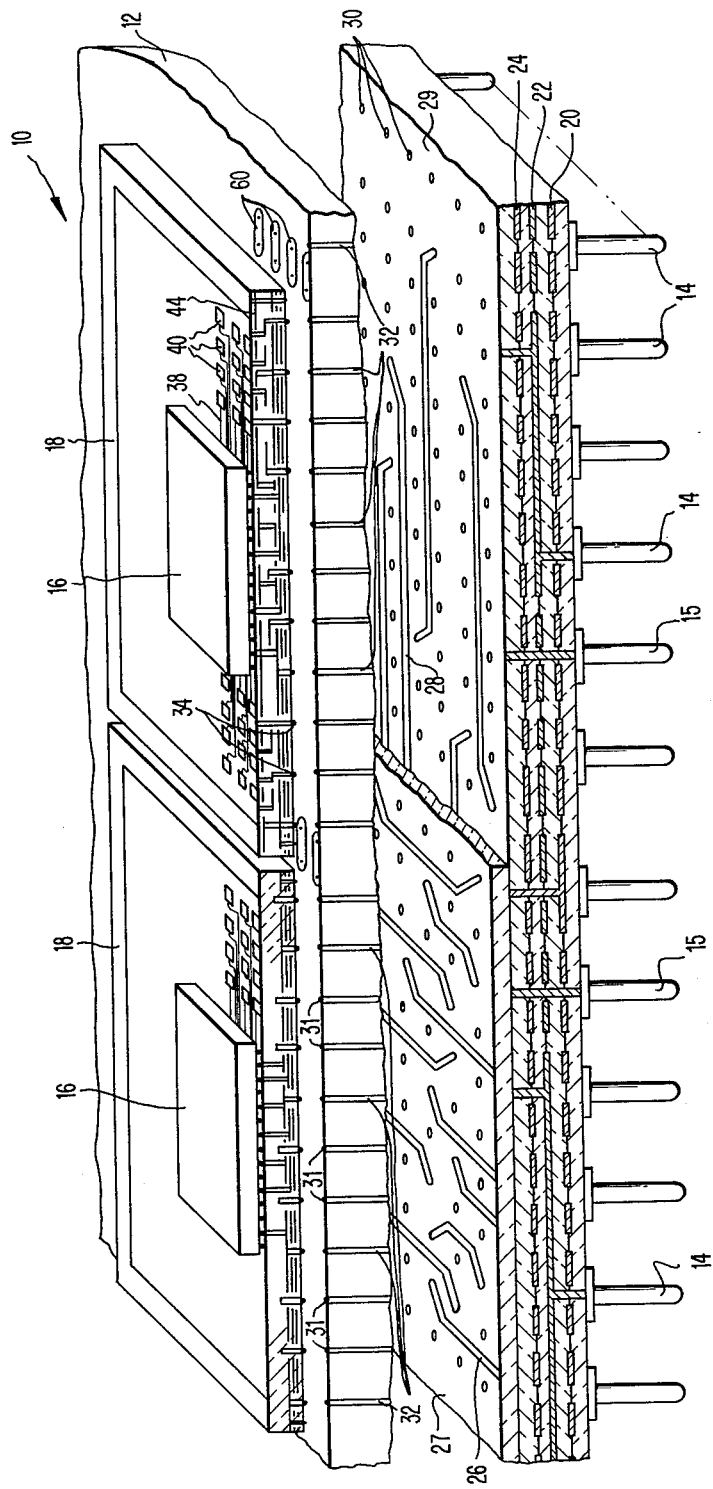
FIG. 1 is a prospective view in broken section showing the arrangement and internal structure of a first preferred specific embodiment of our invention.

As the integrated circuit technology advances towards ever larger scale integration and high performance circuits, the number of drivers which can switch simultaneously on a chip also increases. This imposes a stringent requirement on the power supply system which has to supply high current transients during short time intervals without causing any noise signal called $\Delta I$ noise, in the power distribution system. Noise signals can propagate in the power distribution system and cause false switching if they reach quiescent drives.

For instance an off chip driver has to switch 20 ma current in a 50Ω line to produce a 1 v signal. The power line for fifty simultaneously switching drivers has to supply 1 ampere current for the switching transient instantaneously. Thus viewing from the power line the 50Ω signal lines are connected in parallel with a resulting input impedance of 1Ω. If the input impedance of the power line, viewed from the signal lines is 0.1Ω, the 1 ampere current transient causes approximately a 0.1Ω×1 amp=0.1 V noise voltage in the power lines. This noise voltage has an opposite phase with respect to the signal voltage and thus reduces its amplitude. This indicates the importance of a very low input impedance power line.

The ideal solution for reducing the ΔI noise would be to supply the power for the chips from a large decoupling capacitor located right below the chips and common to all chips. The power connection to each chip is made with vertical wires. One can consider this kind of power distribution system as a radial wave guide. A good summary of radial wave guides can be found in "Waveguide Handbook" edited by N. Marcuvitz, Dover Publishing, 1965 c 1951. The characteristic impedance is defined as $$Z_o = \sqrt{\frac{L}{C}} \tag{1}$$

where L is the inductance and C is the capacitance.

The characteristic impedance at any r radius of the radial waveguide is:

$$Z_o = \frac{\mu}{\epsilon} \frac{b}{2\pi r} \tag{2}$$

where $\mu$ is the permeability, $\epsilon$ is the dielectric constant and b is the separation between planes.

However, since each section is terminated by an impedance that is lower than its characteristic impedence, the actual input impedance $Z_{in}$ is significantly lower than the characteristic impedance at that radius.

$$Z_{in} \simeq Z_o \left[ \frac{\pi K r}{2} + j K r \ln \frac{2}{1.78 K r} \right] ; K = 2\pi f \sqrt{\mu \epsilon} \tag{3}$$

where: f is the frequency

For instance, for a frequency of 160 MC, the input impact impedance at any radius is about 200 times smaller than the characteristic impedance at that radius. In other words, if the radial waveguide is contacted with a 5 mil wire the contact sees the characteristic impedance at 500 mil radius.

The present invention describes two alternative embodiments which use the input impedance leverage of the radial waveguide.

I. The first embodiment with a large decoupling capacitor from which the power is distributed is built up from small capacitors placed on small interposers for yield reasons. These capacitors are, however, connected together with low inductance connections in order to function as one capacitor common to all chips. These interposers which also serve for signal and power redistributions, are mounted on a multi-layer substrate which provides signal interconnections between interposers. The capacitors on each interposer are made with thin film technology and thus the separation between capacitors of this kind with an additional signal redistribution layer represents both a processing and a yield problem. By breaking up the capacitors into small ones and placing them on interposers, both problems can be solved. The processing of the small interposers is easier and their yield higher since each capacitor can be tested individually and only the good ones are joined to the substrate.

It is important that the vertical distance between the chips and the radial waveguide has to be less than ≈50 mils or the large via inductance will cause excessive ΔI noise 2. In the second embodiment a large decoupling capacitor, or radial waveguide, is built up in one piece inside the module or board substrate close to its surface using thick film technology. The separation between capacitor planes is in the range of 4-8 mils and thus high yield can be obtained. The input impedance of any power via contact (r≈2.5 mils) is, however, relatively high, about 0.23Ω for 6 mil plane separation. The input impedance can be lowered by attaching small capacitors on the top of the substrate next to each chip. The resultant impedance is expressed as $$Z_o \simeq \sqrt{\frac{L}{C + \Delta C}} \tag{4}$$

where Δ( is the capacitance of the attached capacitor per unit area.

It is important, however, that the via length interconnecting the attached capacitor with the radial waveguide has to be less than ≈50 mils, and the number of interconnections per voltage planes has to be at least 2. If the above requirements are not kept the interconnection will have an excessive inductance and the approximation in Eq. (4) does not hold.

It is also important, as in the first embodiment, that the via length interconnecting the chips and the radial waveguide be less than ≈50 mils.

Figure 5:
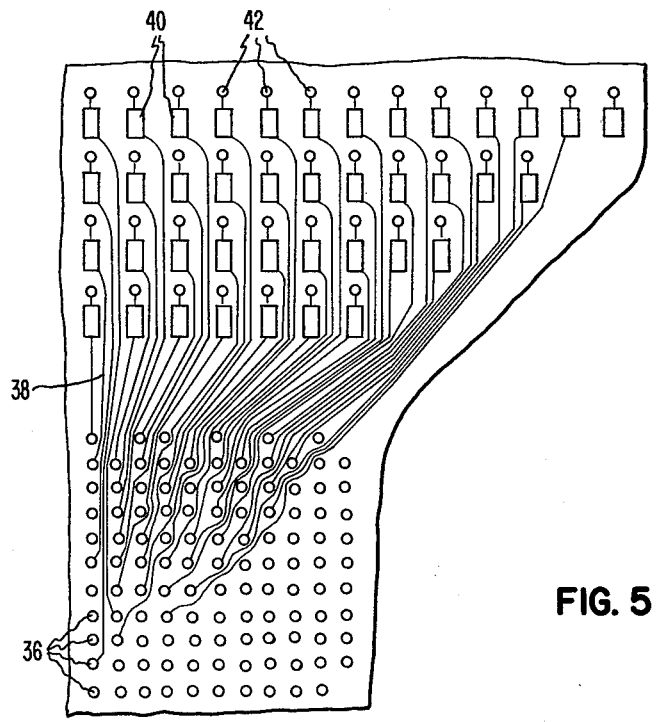
FIG. 5 is a top plan view in enlarged scale illustrating the metallurgy fanout pattern on the interposer element.

Referring now to FIG. 1 of the drawings, there is depicted the first embodiment of a package assembly for interconnecting a plurality of integrated circuit semiconductor devices which embodies a power supply distribution system having a radial waveguide structure with parallel waveguide planes with a low characteristic impedance located parallel to the chips. The semiconductor package 10 has a multilayer ceramic substrate 12 with internal wiring which conveys the power necessary to operate the devices from the I/O pins 14 to the semiconductor devices 16 mounted on interposer structures 18 in turn mounted on the top surface of substrate 12. The multilayer ceramic substrate 12 also includes internal wiring for conveying input and output signals from the I/O pins 14 to the interposer 18 and also between interposers mounted on substrate 12. Included in substrate 12 are a plurality of power planes 20, 22 and 24, connected to pins 14 on which are impressed the voltages necessary for operating the semiconductor devices. Power planes 20, 22 and 24 are relatively solid conductive planes except for openings which will allow vias to extend through the planes. The process and technology for producing a multilayer ceramic substrate 12 is disclosed in detail in commonly assigned application Ser. No. 053,477 filed June 29, 1979. The signal lines in the substrate are arranged on pairs of adjacent planes or sheets as most clearly shown in FIG. 1. Signal lines 26 that run in the X direction are all in one plane 27, wherein signal lines 28 which run in the Y direction are on plane 29. Every X-Y plane pair is sandwiched between two power mesh planes (not shown). Mesh planes consist of parallel conductive lines in both the X and Y directions which overlie the signal lines, and are displaced from via locations. The identical power mesh planes are connected together with vias and serve as shields for signal lines. The mesh planes are also connected to the waveguide planes with vias. This stabilizes the voltage of the mesh planes caused by return currents and thus reduces the "earth noise". Vias 30 provide electrical contact between the various planes in the substrate 12. Solder pads 32 are located on the top surface of substrate 12 over the terminations of vias from within the substrate. Solder pads 32 provide electrical connections to power planes 20, 22 and 24, which are connected to pins 14. Solder pads 31 provide electrical connection to input and output signal vias from internal metallurgy systems within the device which are in turn connected to pins 15. The actual number of wiring planes and power planes in the device can vary depending on the requirements imposed by the number of semiconductor devices which are interconnected. As previously mentioned, interposers 18 are mounted on the top surface of substrate 12 and are interconnected with the substrate by solder bonds 34 in contact with solder pads 32 on the substrate. Each interposer has a top surface metallurgy consisting of a cluster of solder pads 36 joined to a fan-out series of metallurgy lines 38 joined in series to engineering change pads 40 which terminate at vias 42 is shown only in FIG. 5. The top surface metallurgy system is shown most clearly in FIG. 5 of the drawings. The top surface metallurgy pattern of interposers 18 can be formed in any suitable manner, preferably by evaporating a layer of metal on the top surface of the interposer, depositing a layer of photoresist over the metal, exposing the resist to the desired pattern, developing the resist to define the pattern desired, and subsequently etching away the exposed metal with a suitable etchant. It should be noted that photolithographic techniques can be used to form the metallurgy pattern on the interposer, whereas the same technique could not be conveniently used to form a pattern on the overall substrate 12 if one were desired. The ceramic in both the substrate 12 and the interposer shrinks during sintering. The shrinkage is generally not completely uniform over all of the areas of the interposer or substrate. However, since the interposer area is much smaller than the area of the substrate, a match of the pattern with the vias can be accomplished in a smaller area of the interposer. Located directly beneath and in close relation thereto is a solid plane 44 interconnected in the interposer to a suitable voltage, typically ground. Plane 44 is solid except for apertures through which the various vias can extend therethrough. Plane 44 reduces the cross coupling of the closely spaced fan-out lines 38 in the surface metallurgy pattern.

The radial waveguide planes are also used to fan out or redistribute the power vias. The power vias coming from the chip are concentrated within the chip area. As shown in FIG. 1, most of these power vias are interrupted at the waveguide planes and moved to other locations outside the chip. This provides an effective intermixing of power and signal vias and also pins, thus reducing the inductance of the off module power connections.

Figure 4:
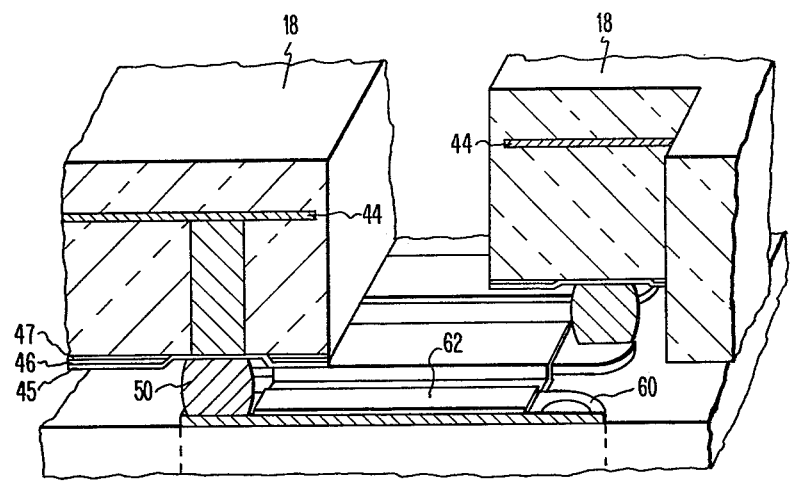
FIG. 4 is a prospective view in broken section illustrating the connection between adjacent interposers mounted on a substrate.

Referring now to FIG. 3 a plurality of waveguide planes are provided on the bottom surface of interposer 18. The planes 45, 46, and 47 are formed of substantially solid layers of a metal typically aluminum or tantalum that is applied to the bottom surface of the interposer by any suitable technique. The metal layers can be applied by evaporation, electrodeposition, or screening. The layers 44, 46 and 47 are separated and electrically isolated from each other by dielectric layers 48 preferably formed by oxidizing the metal of the adjacent waveguide plane. The arrangement of the waveguide planes is also shown in FIG. 4. Each of the waveguide planes 45, 46 and 47 are connected to solder pads 50 which are in turn interconnected by vias which extend through substrate 12 to the power planes 20, 22 and 24. As shown in FIG. 2, the solder pads 50 make separate contact to each of the waveguide planes. In the area surrounding the pad joined to the waveguide plane, the preselected waveguide plane extends inwardly to the solder pad 50. As shown in FIG. 3, solder pad 50A is in electrical contact with the waveguide plane 45. The waveguide planes also serve collectively as a decoupling capacitor located close to the semiconductor devices. The resultant waveguide planes provide a power supply distribution system that is relatively inexpensive to produce, very effective in that it is placed very close to the semiconductor devices, and can be produced using well known present technology. Additional waveguide planes can be provided if necessary or required by the particular application. As indicated in FIG. 2, the interposers 18 can have more than a single device. The interposer 18 in FIG. 2 is illustrated showing four devices 16 mounted on the interposer and interconnected with metallurgy within the interposer.

As shown in FIG. 4, all of the corresponding waveguide planes on each of the interposers are interconnected using the structure shown in FIG. 4. Metallurgy stripes 60 are provided on the top surface of substrate 12. A short length of dielectric material 62 overlies the central portion of stripe 60 providing a dam for the solder material during reflow joining. Pad 50 connected to a waveguide plane is joined to a similar waveguide plane in the adjacent interposer through metallurgy stripe 60 which is also connected to a similar solder pad on the adjacent interposer.

Figure 6:
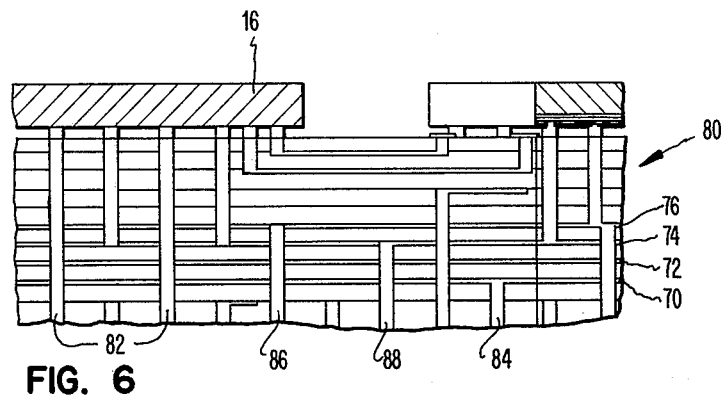
FIG. 6 is a front elevational view in broken section illustrating a second preferred specific embodiment of the package assembly of our invention.
Figure 7:
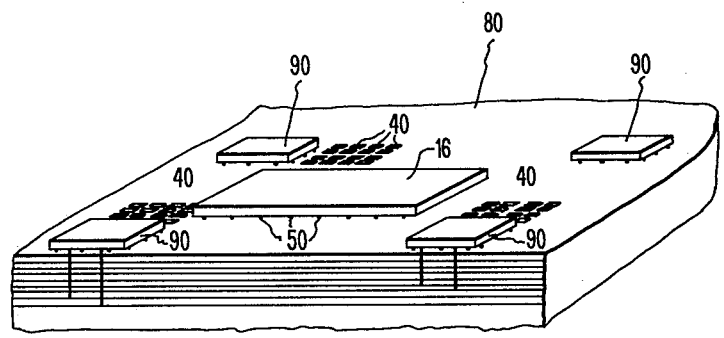
FIG. 7 is a prospective view of the substrate of the second preferred specific embodiment of the invention.

A second embodiment of the package assembly of the invention which incorporates a power supply distribution system, including radial waveguide structure with radial waveguide planes, with low characteristic impedence is shown in FIGS. 6 and 7. In the embodiment shown in FIG. 6, the waveguide planes 70, 72, 74 and 76 are located in multilayer ceramic substrate 80. The waveguide planes are connected to power plane (not shown) in the lower portion of substrate 80 by vias 82, 84, 86 and 88. Semiconductor devices 16 are mounted directly on the surface of substrate 80, preferably by solder bonding. Engineering change pads 40 are provided on the surface which are, in turn, interconnected to solder pads 50 of device 16. The interconnection between the engineering change pads 40 and the solder bonds are made with internal wiring patterns in the substrate 80. Power vias extend upwardly from the waveguide planes 70, 72, 74 and 76 to the power terminals of semiconductor device 16 as shown in FIG. 6. Also provided on the surface of the substrate 80 are a plurality of decoupling capacitors 90, preferably located diagonally off each corner of the device 16. This location of the decoupling capacitor is desirable because less interference is encountered with the fanout pattern metallurgy connecting the pads to the engineering change pads. Each of the decoupling capacitors 90 has a plurality of conductive layers separated by a dielectric layer. The decoupling capacitor can be formed by depositing a layer of a suitable metal such as aluminum or tantalum, oxidizing the metal to form a dielectric layer, and subsequently depositing another layer of metal.

Solder connections are made to each of the conductive layers of the capacitor in generally the same manner described in relation to the waveguide planes on the bottom surface of the interposers 18 as illustrated in FIG. 4 of the drawings. Each of the layers in the decoupling capacitor 90 are interconnected to a waveguide plane 70, 72, 74 or 76 as illustrated in FIG. 6. The combination of decoupling capacitors 90 and the solid waveguide plane 70, 72, 74 and 76 results in an input impedance of less than 0.2 ohms. The decoupling capacitors 90 are necessary in this embodiment since the waveguide planes 70 through 76 have a spacing that is governed by the thickness of the green sheets used to form the substrate. In contrast, in the embodiment shown in FIGS. 1 through 5, the waveguide planes on the bottom surface of the interposers are closely spaced i.e., by the thickness of the oxidized or anodized layer of the plane. In the fabrication of the embodiments of this invention, it is desirable that the power vias and the signal vias within the substrate be interspersed as uniformly as possible. This reduces the inductance of the off chip power connection. This reduces the ΔI noise caused by simultaneous switching of intermodule drivers.

While the invention has been shown and particularly described with reference to a preferred embodiment, it will be understood by those skilled in the art that various changes in form and detail may be made therein without departing from the spirit and scope of the invention.

What is claimed is:

1. A package assembly for interconnecting a plurality of integrated circuit semiconductor devices having a multi-layer dielectric material substrate with a signal fan-out wiring pattern and internal wiring metallurgy interconnecting the semiconductor devices, a plurality of integrated circuit semiconductor devices supported on the top surface of the substrate in electrically connected operative relation, and external signal and power connection means, the improvement comprising
a power supply distribution system for connecting electrical supply voltages to said devices from power connection means comprised of radial waveguide structure with parallel waveguide planes with a low input impedance, said waveguide planes located between said signal fan-out wiring pattern and the said internal wiring metallurgy in said substrate, vertical vias connecting said waveguide planes to said devices and external connection means, said waveguide planes connected in common to all of said plurality of devices.

2. The package assembly of claim 1 wherein said dielectric material of said substrate is ceramic material.

3. The package assembly of claim 1 wherein said dielectric material of said substrate is a polymerized organic resin material.

4. The package assembly of claim 1 wherein said vertical vias was interspersed between signal vias which provide vertical interconnections for said signal wiring planes.

5. The package assembly of claim 4 wherein the input impedance of said radial waveguide structure is less than 0.2 ohms.

6. The package assembly of claim 5 wherein the vertical distance between said devices on the top surface of said substrate and said waveguide planes is less than 60 mils.

7. The package assembly of claim 6 wherein said substrate further includes power planes positioned between sets of X and Y signal wiring planes, and vias interconnecting said waveguide planes with said power planes.

8. The package assembly of claim 1 wherein the substrate includes multilayer ceramic interposers and a base, said interposers mounted on said base, each interposer having at least one cluster of solder pads on the top surface, at least one semiconductor device operatively mounted on said cluster of solder pads, a decoupling capacitor on the bottom side comprised of a plurality of said parallel waveguide planes, power vias connecting said waveguide planes to said power connection means on said base.

9. The package assembly of claim 8 wherein a plurality of interposers are provided in the package assembly, and the respective parallel waveguide planes in said interposers are interconnected with said power connection means by vias and solder pad connections on the surace of said base.

10. The package assembly of claim 9 wherein a plurality of devices are mounted on each of said interposers.

11. The package assembly of claim 8 wherein said waveguide planes on said interposers are comprised of substantially solid layers of a metal selected from the group consisting of Al and Ta, said waveguide planes separated from each other by a dielectric layer formed of oxidized metal of said waveguide planes.

12. The package assembly of claim 8 which includes a surface fan out metallurgy pattern connected to said cluster of solder pads, and a solid internal conductor plane within said interposer in close proximity to said fan out metallurgy layer.

13. The package assembly of claim 8 wherein signal vias are interspersed between said vertical power vias in said base.

14. The package assembly of claim 13 wherein the input impedance of said radial waveguide structure is less than 0.2 ohms.

15. The package assembly of claim 12 which further includes engineering change pads including surface deletable links associated with said fan-out metallurgy pattern.

16. The package assembly of claim 1 wherein said waveguide planes are metal metallurgy layers disposed in said substrate in close proximity to the surface, device power vias extending from said waveguide planes to the substrate surface to selected pads in said pad cluster, discrete capacitor elements mounted on the top surface of said substrate, and capacitor vias extending from said waveguide planes to said capacitor elements.

17. The package assembly of claim 16 wherein said capacitor elements have a plurality of metal layers corresponding to said waveguide planes, and said capacitor vias connect corresponding waveguide planes with corresponding layers in said capacitor elements.

18. The package assembly of claim 17 which includes a plurality of engineering change pads on the surface of said substrate in surrounding relation to each device mounted thereon, said engineering change pads connected to said cluster of solder pads, said capacitor elements mounted in close proximity to said devices in diagonal relation of each corner thereof.

19. The package assembly of claim 18 wherein the electrical connections between said cluster of solder pads and said engineering pads are internal metallurgy lines in said substrate adjacent the top surface and above said waveguide planes.

20. The package assembly of claim 17 wherein said metal layers and the corresponding waveguide planes are interconnected with spaced power vias that are interspersed with signal line vias.

* * * * *